(12) United States Patent
Nien et al.

(10) Patent No.: US 7,682,552 B2
(45) Date of Patent: Mar. 23, 2010

(54) CAPACITIVE MEASUREMENT METHOD AND SYSTEM FOR NANOIMPRINT PROCESS MONITORING

(75) Inventors: Chin-Chung Nien, Hsin Chu (TW); Ta-Chuan Liu, Taipei (TW); Hong Hocheng, Hsin Chu (TW)

(73) Assignee: Industrial Technology Research Institute, HsinChu (TW)

( * ) Notice: Subject to any disclaimer, the term of this patent is extended or adjusted under 35 U.S.C. 154(b) by 1237 days.

(21) Appl. No.: 10/851,113

(22) Filed: May 24, 2004

(65) Prior Publication Data

US 2005/0212178 A1 Sep. 29, 2005

(30) Foreign Application Priority Data

Mar. 26, 2004 (TW) .............................. 93108225 A

(51) Int. Cl.
*G01B 11/00* (2006.01)
(52) U.S. Cl. .................... 264/408; 264/406; 425/174.6
(58) Field of Classification Search ................ 264/406, 264/408, 293, 40.1, 40.5, 319, 320; 425/149, 425/385, 136, 174.6
See application file for complete search history.

(56) References Cited

U.S. PATENT DOCUMENTS

| 4,352,060 | A | * | 9/1982 | Garpendahl et al. | 324/662 |
| 4,510,103 | A | * | 4/1985 | Yamaguchi et al. | 264/408 |
| 5,082,436 | A | * | 1/1992 | Choi et al. | 425/174.8 R |
| 5,512,836 | A | * | 4/1996 | Chen et al. | 324/687 |
| 6,309,580 | B1 | * | 10/2001 | Chou | 264/338 |

* cited by examiner

*Primary Examiner*—Christina Johnson
*Assistant Examiner*—Galen Hauth
(74) *Attorney, Agent, or Firm*—WPAT, PC; Justin King

(57) ABSTRACT

The present invention relates to a capacitive measurement method and system for a nanoimprint process, which arranges a plurality of electrode plates on both the backside of the master mold and the surface of the supporting base carrying the wafer substrate to form a plurality of capacitive structures. By monitoring the capacitance variation signal caused by the continuous variations in the thickness and the material properties of the resist during the imprint process, the status of the resist can be monitored and recorded, which is used as the references for determining the timing to demold in the nanoimprint process and for maintaining the flatness of the resist. Accordingly, the nanoimprint process can be automated easier and the quality and the throughput of of the nanometer scaled imprint product can be improved.

6 Claims, 7 Drawing Sheets

A-A' Section

CAPACITIVE MEASUREMENT METHOD AND SYSTEM FOR NANOIMPRINT PROCESS MONITORING

FIELD OF THE INVENTION

The present invention relates to a monitoring method and system for imprint process, more particularly to a capacitive measurement method and system for nanoimprint process monitoring. That is, the present invention utilizes a plurality of capacitive structures to monitor the timing of demolding during an imprint process for improving the imprint quality and efficiency.

BACKGROUND OF THE INVENTION

With the advances in the nanotechnology, the demands of ability to build materials and products in nanometer scale, or even atomic precision are increased rapidly. Accordingly, various technologies of nanometer processing have been discussed and developed vigorously. Among those technologies that have been made public, the nanoimprint lithography (NIL) is a promising technology that possesses the potential advantages of low cost and high yield. The technology of nanoimprint lithography requires only a single imprinting step to repetitively transfer the same nanostructured pattern on a large area wafer substrate, which can be applied to nanometer electronics, optical components, high density storage devices, nanometer electromagnetic devices, biological apparatuses, transducers, nanometer electromechanical components, and so on.

However, although the nanoimprint lithography technology possesses the above-mentioned advantages and potentials, there're still few drawbacks required to be improved after the technology was published a few years ago. For instance, the alignment capability accompanied with the fabrication of multi layer components, the large scale molds for enhancing throughput, the high-density nanopatterning molds, mold sticking, polymer solidification, imprint temperature and pressure, the life of mold, and the making of the standards in determining the quality of the end products and the effectiveness of the products, are just some examples required to be dealt with. For these reasons, the technology of nanoimprint lithography is not practically commercialized yet, but is realized only in forms of laboratory prototypes or some research oriented machines. Among those issues, the improvement of the throughput is the most critical one. Therefore, how to perform an online real-time monitoring on the process parameters currently tuned manually to realize the automated processing and to enhance the throughput becomes the ultimate goal of commercializing the nanoimprint technology.

Moreover, in the entire nanoimprint process, the status of the resist being embossed by a mold and the timing to demold are the critical factors affecting the product quality. Please refer to Attachment 1, which is extracted from the paper published in the Institute of Physics Publishing by H. Schift et al. in 2001 depicting the defects caused by the poor processing parameters setting for defining the timings of imprinting and demolding in the nanoimprint process. If demolding too early, the quality of the nanopatterning structures and components will be degraded and the products will be unable to commercialize. If demolding too late, although the quality of the products may be improved, the production throughput will be severely reduced due to the overall prolonged imprint duration. Therefore, to maintain the accuracy of the products within nanometer scale and also raise the overall throughput of the imprint process, an online real-time monitoring must be performed for monitoring the status of the resist being embossed by a mold in order to obtain the real-time information of the status of the resist and achieve an automated processing control.

The primary object of the present invention is to provide a simple and accurate method and system capable of monitoring and recording the real-time status of the resist being embossed by a mold as timing references for demolding in a nanoimprint process, and therefore automating the nanoimprint process, improving the quality of the nanopatterning products and the raising the throughput of the nanoimprint process.

SUMMARY OF THE INVENTION

The primary object of the present invention is to provide a capacitive measurement method and system for nanoimprint process monitoring capable of using a capacitive structure formed by two electrode plates disposed respectively on a master mold and a surface of a substrate to monitor the imprint process by the variations of capacitance.

Another object of the present invention is to provide a capacitive measurement method and system for nanoimprint process monitoring, capable of monitoring the capacitance variations at a plurality of locations to control the flatness of the imprint process using a plurality of capacitive structures formed by respectively arranging a plurality of electrode plates on a master mold and a surface of the substrate.

To achieve the above-mentioned objects, the capacitive measurement method for nanoimprint process monitoring of the present invention includes the steps of:
 (a) providing a master mold, comprising a patterned surface and a backside corresponding to the patterned surface, wherein a top electrode plate device is arranged on the backside and is connected to a signal processing system through at least a top wire;
 (b) providing a supporting base, comprising a bottom electrode plate device formed at a specific position of the surface thereof, the bottom electrode plate device being connected to the signal process system through at least a bottom wire;
 (c) arranging a substrate coated with a resist on the supporting base, and then placing the master mold above the substrate so that the top electrode plate device is corresponding with the bottom electrode plate device to form a capacitive device;
 (d) imprinting the master mold onto the resist of the substrate, wherein the continuous variations in the thickness and the material properties of the pressed resist will cause the capacitance to change, which is detected and sent to the signal processing system by the capacitive device;
 (e) monitoring the status of the imprint process according to the capacitance variation received by the signal processing system.

To achieve the above objects, the monitoring system for the imprint process of the present invention comprises an master mold, a supporting base, and a signal processing system.

The master mold further comprises comprising a patterned surface and a backside corresponding to the patterned surface, wherein a top electrode plate device formed by a plurality of independent conduction plates is arranged on the backside and is connected with at least a top wire.

The supporting base is used for carrying a substrate to be imprinted, wherein a bottom electrode plate device formed by a plurality of independent conduction plates is arranged at a specific location of the surface of the supporting base, and is connected with at least a bottom wire. In addition, the bottom electrode plate device is disposed corresponding to the top electrode plate device forming a capacitive device, which comprises a plurality of independent capacitive structures.

The signal processing system comprises: a detection circuit, a signal modulation/processing circuit, and a monitor/control device. Wherein the detection circuit is connected to the top and the bottom wires for transmitting and receiving capacitance variation signals transmitted by the top and the bottom wires, and the signal modulation/processing circuit is capable of receiving, modulating, demodulating, processing, and transmitting capacitance variation signals transmitted from the detection circuit. The monitor/control device is used for evaluating and controlling the operation of the master mold according to the capacitance variation signals received from the signal modulation/processing circuit.

In this regard, a capacitive measurement method for nanoimprint process monitoring according to another preferred embodiment of the present invention includes the steps of:

(a) providing a top master mold, comprising a patterned surface and a backside corresponding to the patterned surface, wherein a top electrode plate device is arranged on the backside and is connected to a signal processing system through at least a top wire;

(b) providing a bottom master mold, comprising a patterned surface and a backside corresponding to the patterned surface of the bottom master mold, wherein a bottom electrode plate device is arranged on the backside of the bottom master mold and is connected to a signal processing system through at least a bottom wire;

(c) arranging a substance to be imprinted between the top and the bottom master molds, wherein the patterned surface of the top master mold faces toward the patterned surface of the bottom master mold and a capacitive device is formed by aligning the top electrode plate device with the bottom electrode plate device;

(d) performing the imprint process on the substance by pressing the top master mold and the bottom master mold toward each other with a compression system, wherein the continuous variations in the thickness and the material properties of the pressed resist will cause the capacitance to change, which is detected and sent to the signal processing system by the capacitive device;

(e) monitoring the status of the imprint process according to the capacitance variation received by the signal processing system.

With respect to the foregoing imprint method, a monitoring system for the imprint process of the present invention comprises a top master mold, a bottom master mold, a substance to be imprinted, and a signal processing system.

The top master mold comprises a patterned surface of the imprint pattern and a backside corresponding to the patterned surface, wherein a top electrode plate device formed by a plurality of independent conduction plates is arranged on the backside of the top master mold and is connected with at least a top wire.

The bottom master mold comprises a patterned surface of the imprint pattern and a backside corresponding to the patterned surface of the bottom master mold, wherein a bottom electrode plate device formed by a plurality of independent conduction plates is arranged on the backside of the bottom master mold and is connected with at least a bottom wire. Moreover, the substance to be imprinted is arranged between the top and the bottom master molds and is placed on the bottom master mold.

The signal processing system comprises: a detection circuit, a signal modulation/processing circuit, and a monitor/control device. Wherein the detection circuit is connected to the top and the bottom wires for transmitting and receiving capacitance variation signals transmitted by the top and the bottom wires, and the signal modulation/processing circuit is capable of receiving, modulating, demodulating, processing, and transmitting capacitance variation signals transmitted from the detection circuit. The monitor/control device is used for evaluating and controlling the operation of the master mold according to the capacitance variation signals received from the signal modulation/processing circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1:
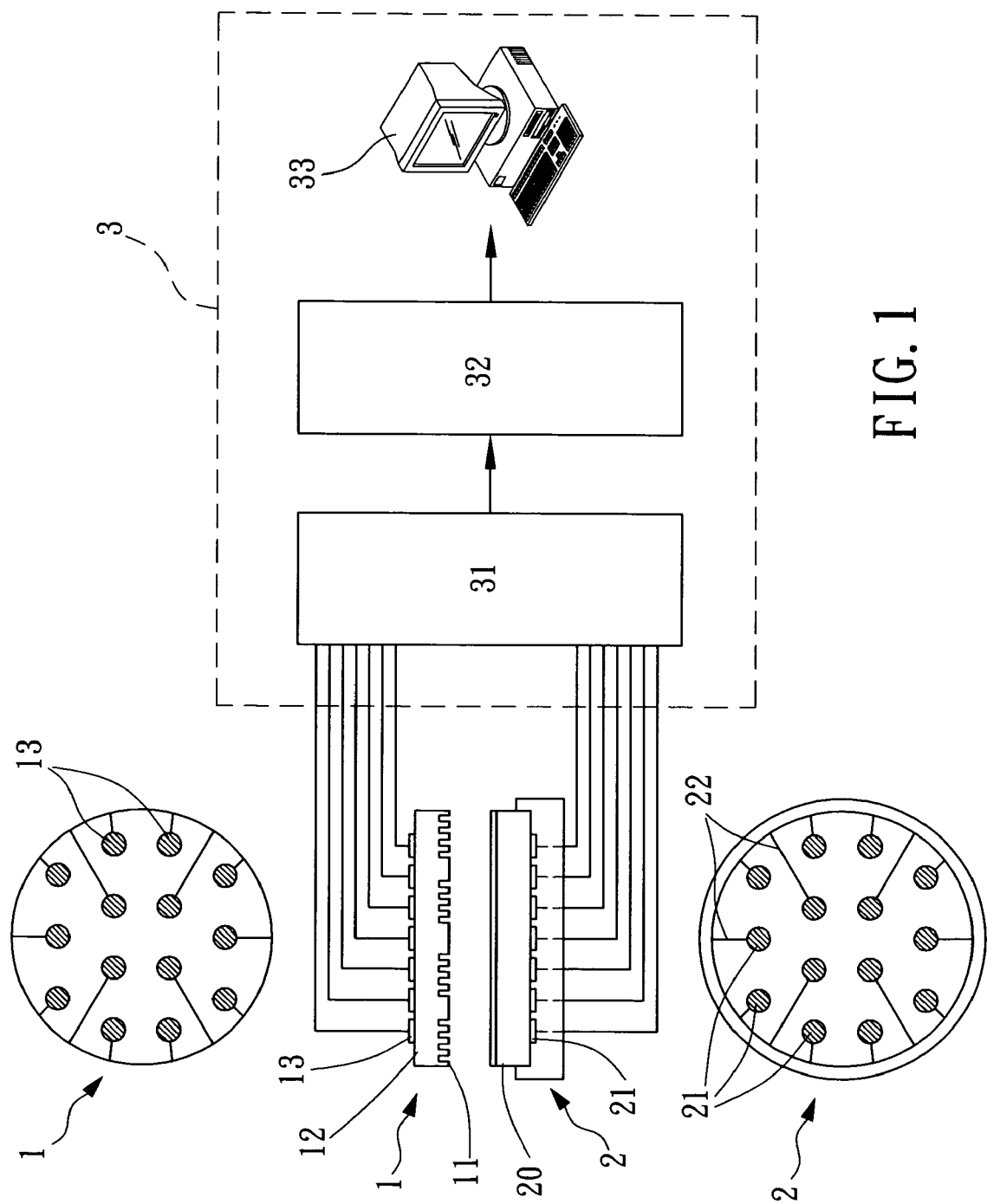
FIG. 1 is a schematic diagram of a capacitive measurement system for imprint process monitoring according to a preferred embodiment of the present invention.

Please refer to FIG. 1, which is a schematic diagram of a capacitive measurement system for imprint process monitoring according to a preferred embodiment of the present invention. As shown in FIG. 1, the capacitive measurement system for imprint process monitoring comprises a master mold 1, a supporting base 2, and a signal processing system 3. Wherein the master mold 1 possesses a patterned surface 11 of the imprint pattern and a corresponding backside 12. A top electrode plate device 13 is arranged at the specific locations of the backside 12 formed by either a conduction plate or a plurality of independent conduction plates, which connects with at least a top wire 14. In the preferred embodiment of the present invention, the top electrode plate device 13 and the top wires 14 are formed on the backside 12 with the surface micromachining, IC processing, and MEMS technologies. The master mold has to be a material with high resistance, or else a layer of material with high resistance has to be coated on the backside of the master mold 1 to avoid the conduction with the top electrode plate device 13 and the top wires 14.

Moreover, the top electrode plate device 13 and the top wires 14 can be either coplanar or not. In another preferred embodiment of the present invention, the top electrode plate device 13 and the top wires 14 are arranged on the master mold 1 independently and can be integrated on a master mold supporting device. Similarly, the master mold has to be a material with high resistance, or else a layer of material with high resistance has to be coated on the backside of the master mold 1 to avoid the conduction with the top electrode plate device 13 and the top wires 14.

The supporting base 2 is capable of carrying the wafer substrate 20 for imprinting, wherein its surface possesses a bottom electrode plate device 21 formed by either a conduction plate or a plurality of independent conduction plates, which connects with one or several bottom wires 32. In the preferred embodiment of the present invention, the bottom electrode plate device 21 and the bottom wires 22 are formed with the surface micromachining, IC processing, and MEMS technologies. Moreover, the bottom electrode plate device 21 and the corresponding top electrode plate device 13 form a capacitive device, which has either one or several capacitive structures depending on the structures of the top 13 and the bottom electrode plate device 21. For instance, if the top electrode plate device 13 comprises a plurality of independent conduction plates and the bottom electrode plate device 21 is a structure of a single conduction plate, the capacitive device formed possesses a plurality of capacitive structures; if both the top electrode plate device 13 and the bottom electrode plate device 21 comprise a plurality of independent conduction plates that are arranged opposite to each other, the capacitive device formed also possesses a plurality of capacitive structures; if both the top electrode plate device 13 and the bottom electrode plate device 21 are a single conduction plate, the capacitive device formed is a single capacitive structure. To prevent the conduction of the bottom electrode plate 21 and the wafer substrate 20 from affecting the capacitance, substrates with high resistance are adopted in the preferred embodiment of the present invention. In another preferred embodiment of the present invention, a material with high resistance is arranged on top of the plurality of bottom electrode plates 21 and the bottom wires 22.

The signal processing system 3 comprises: a detection circuit 31, a signal modulation/processing circuit 32, and a monitor/control device 33. Wherein the detection circuit 31 connects with the top 13 and the bottom wires 22 for transmitting and receiving the capacitance variation signals transmitted by the top 13 and the bottom wires 22. The signal modulation/processing circuit 32 is capable of receiving, modulating, demodulating, processing, and transmitting the capacitance variation signals transmitted by the detection circuit 31. The monitor/control device 33 is, on the other hand, used for receiving the capacitance variation signals transmitted by the signal modulation/process circuit 32 to determine the timing of stopping the imprint process.

Figure 2:
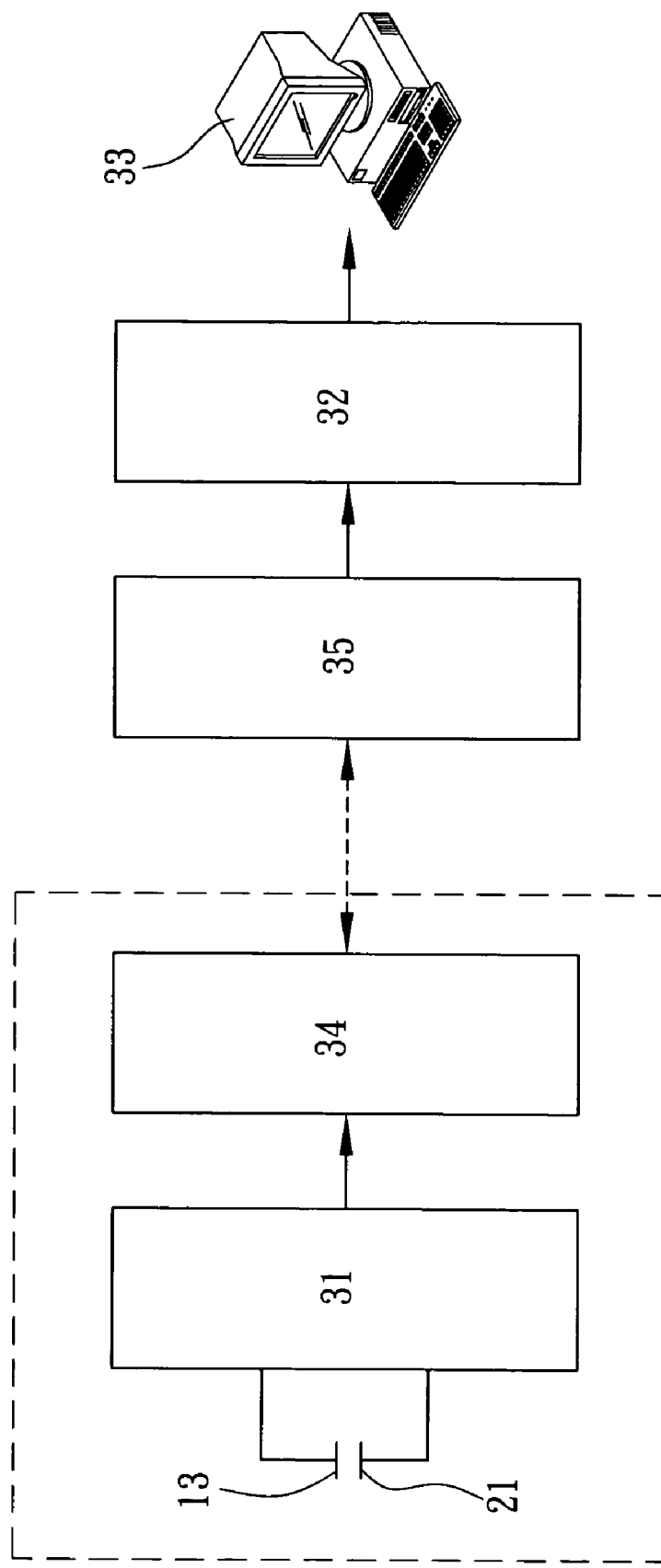
FIG. 2 is a schematic diagram of a capacitive measurement system for imprint process monitoring according to another preferred embodiment of the present invention.

In the preferred embodiment of the present invention, the detection circuit 31, the signal modulation/processing circuit 32, and the monitor/control device 33 are connected through wires. However, in another preferred embodiment of the present invention as shown in FIG. 2, the signal received by the detection circuit 31 can be transmitted wirelessly through an electrical signal transmitter 34, which is then received by a radio frequency transceiver 35 and transmitted to the signal modulation/processing circuit 32 and the monitor/control device 33.

Figure 3:
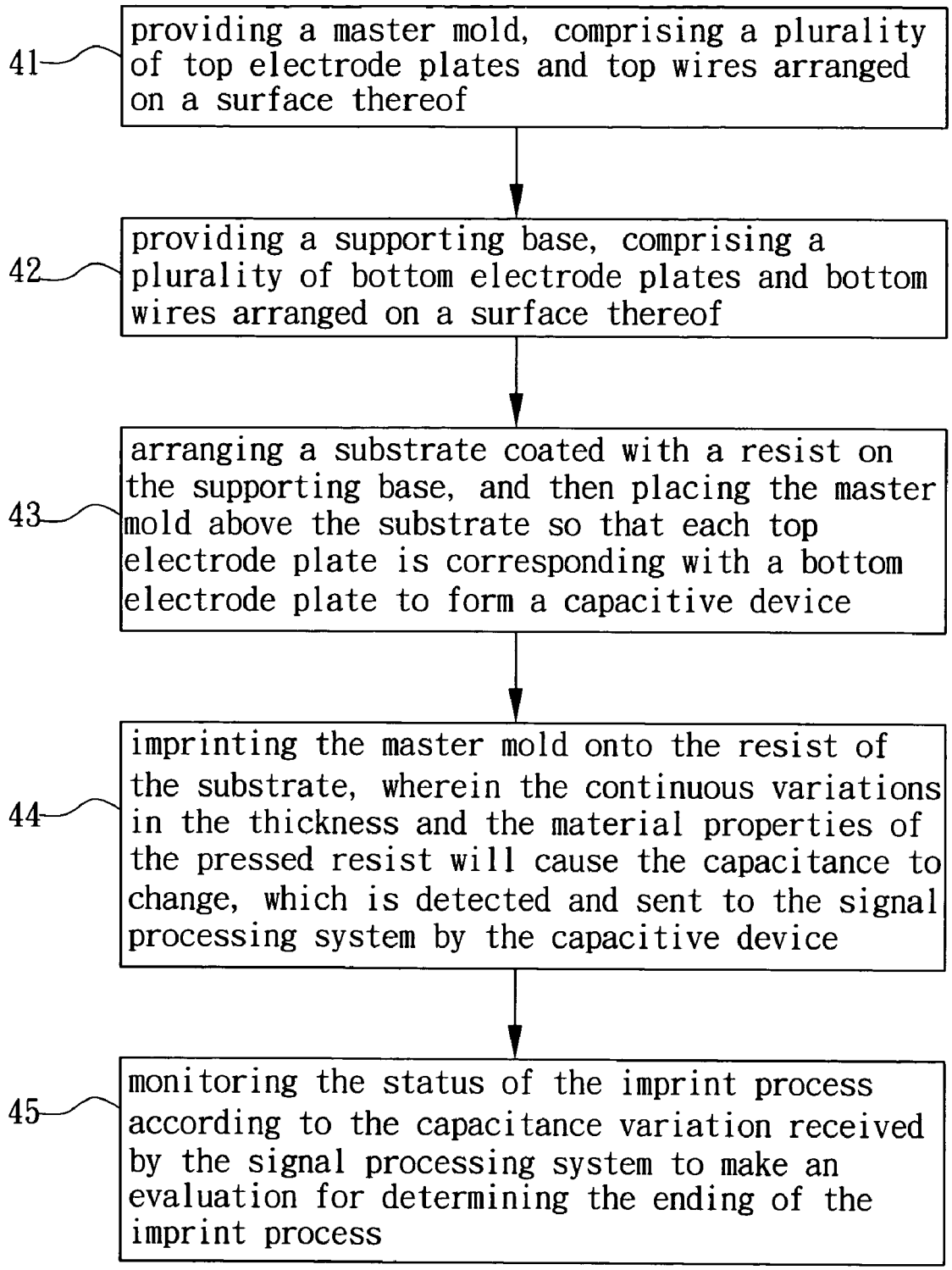
FIG. 3 is a flow chart of a capacitive measurement method for nanoimprint process monitoring according to the present invention.

Please refer to FIG. 3, which is a flow chart of a capacitive measurement method for nanoimprint process monitoring of the present invention. As shown in the figure, the procedure includes:

41) providing a master mold, comprising a patterned surface of the imprint pattern and a corresponding backside of the patterned surface, wherein a top electrode plate device is arranged on the backside and is connected to a signal processing system through at least a top wire;

42) providing a supporting base, wherein a bottom electrode plate device is arranged on the surface and is connected to the signal process system through at least a bottom wire;

43) arranging a substrate coated with a resist on the supporting base, and then placing the master mold above the substrate so that the top electrode plate device is corresponding with the bottom electrode plate device to form a capacitive device;

44) imprinting the master mold onto the resist of the substrate, wherein the continuous variations in the thickness of the pressed resist will cause the capacitance to change, which is detected and sent to the signal processing system by the capacitive device;

45) making an evaluation to stop the imprint process according to the capacitance variation received by the signal processing system.

During the imprint process, the resist varies in the mold continuously. Since the variations happened inside the capacitor formed by the top and bottom electrode plates, the capacitance of the capacitor varies not only with the separation of the top and the bottom electrode plates, but also the continuous variation of quality and quantity of the medium existed in-between the top and bottom plates. By comparing the signal-processed overall capacitance variation with the capacitance variation without adding the resist, the status of the imprint process can be determined.

In the preferred embodiment of the present invention, the timing of the signal processing system in Step 45) to stop the imprint process is when the received variation of capacitance reaches a default value, which is a capacitance parameter saved by the database of the signal processing system according to different patterns and materials. As the imprint depth and mold filling achieve the default value when the signal received by the signal processing system matches with the parameter in the database, that the signal processing system will command the master mold to stop and demold after a predefined period for the resist to solidify. Accordingly, the imprint process can be processed with the best production rate.

Furthermore, by utilizing a plurality of capacitive devices formed by different types of top and bottom electrode plate structures, the system of the present invention can monitor the flatness of the imprint process by determining the variations of capacitance in each capacitive devices. If the differences between each capacitance variation exceed a default value, it indicates the problem in the flatness of the imprint process that the signal processing system can stop the imprint process and alarm the workers on duty to draw out the product and rework. As the result, the stability and throughput of the product can be assured and the industrial utilization can greatly be improved.

Figure 4:
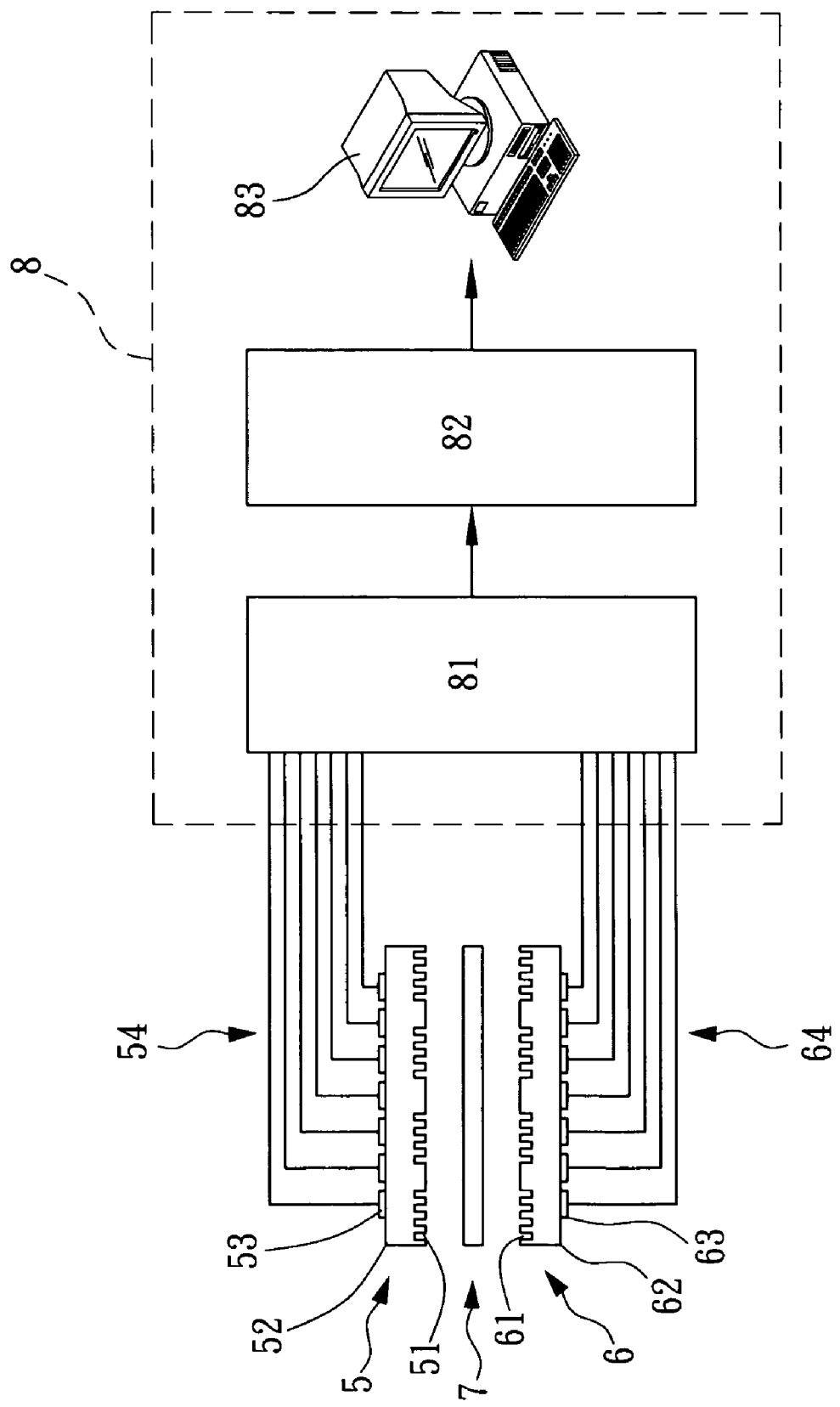
FIG. 4 is a schematic diagram of a capacitive measurement system for imprint process monitoring according to yet another preferred embodiment of the present invention.

The preferred embodiment describes the application of the present invention in monitoring the imprint process of the single-sided wafer using the capacitive structures. In fact, the present invention can be applied to a double-sided wafer imprint process as well. Please refer to FIG. 4, which is a schematic diagram of a capacitive measurement system for the imprint process monitoring according to another preferred embodiment of the present invention. As shown in FIG. 4, the capacitive measurement system for the imprint process monitoring comprises a top master mold 5, a bottom master mold 6, a substance for imprint 7, and a signal processing system 8. Wherein the top master mold 5 possesses a first patterned surface 51 of the imprint pattern and a corresponding first backside 52. A top electrode plate device 53 is arranged on the first backside of the top master mold 52 formed by either a conduction plate or a plurality of independent conduction plates, which connects with one or several top wires 54. In this preferred embodiment of the present invention, the top electrode plate device 53 and the top wires 54 are formed on the first backside of the top master mold 52 with the surface micromachining, IC processing, and MEMS technologies. In another preferred embodiment of the present invention, the top electrode plate device 53 and the top wires 54 are arranged on the top master mold 5 independently and can be integrated into a top master mold supporting device.

The bottom master mold 6 possesses a second patterned surface 61 of the imprint pattern and a corresponding second backside 62. A bottom electrode plate device 63 is arranged on the second backside formed by either a conduction plate or a plurality of independent conduction plates, which connects with one or several bottom wires 64. In this preferred embodiment of the present invention, the bottom electrode plate device 63 and the bottom wires 64 are formed on the second backside of the bottom master mold 62 with the surface micromachining, IC processing, and MEMS technologies. In another preferred embodiment of the present invention, the bottom electrode plate device 63 and the bottom wires 64 are arranged on the bottom master mold 6 independently and can be integrated into a bottom master mold supporting device.

The substance to be imprinted 7 is arranged between the top 5 and the bottom master molds 6. By compressing the top 5 and the bottom master molds 6 toward each other with the top and bottom master mold carriers, the double-sided imprint process can be carried out on the substance to be imprinted 7. In fact, the substance to be imprinted 7 can also be placed on the bottom master mold 6. Moreover, in another preferred embodiment of the present invention, either the first patterned surface 51 or the second patterned surface 61 can be a plane surface. For instance, if the substance to be imprinted 7 is the wafer substrate applied with the resist described previously, the second patterned surface 61 can be a plane surface that the substance to be imprinted 7 can be placed on directly. In this case, the bottom master mold 6 simply becomes a mold provided for the bottom electrode plate device. The advantage of this method is the flexibility that when changing the top and bottom electrode plate patterns, the relativity of the top and the bottom electrode plate devices forming each capacitive devices can be well maintained.

The signal processing system 8 is similar to the signal processing system 3 in the previous preferred embodiment, which also comprises: a detection circuit 81, a signal modulation/processing circuit 82, and a monitor/control device 83. Their operations and functions are similar to those in the previous preferred embodiment.

Figure 5A:
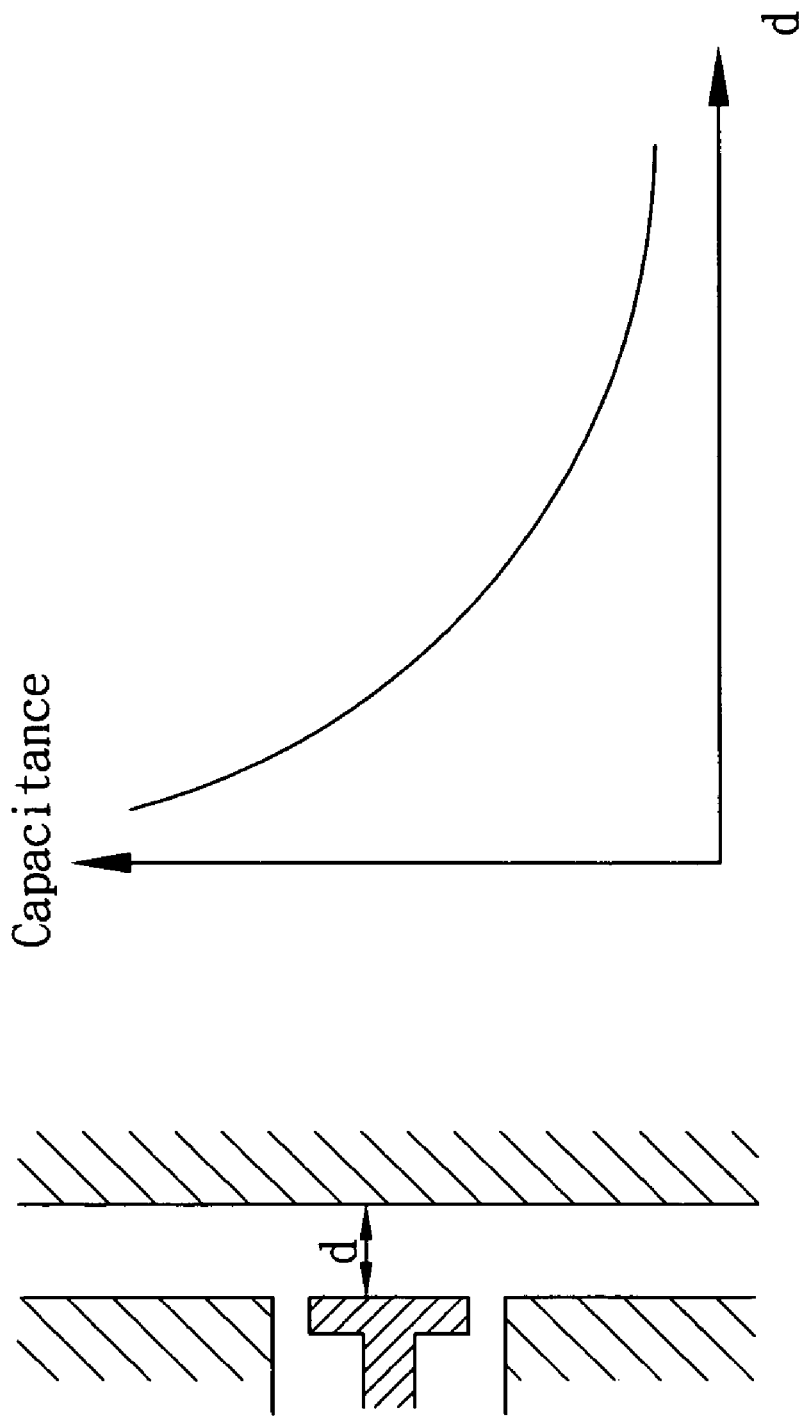
FIG. 5A is a profile of capacitance as a function of the distance for a conventional plate capacitor.
Figure 5B:
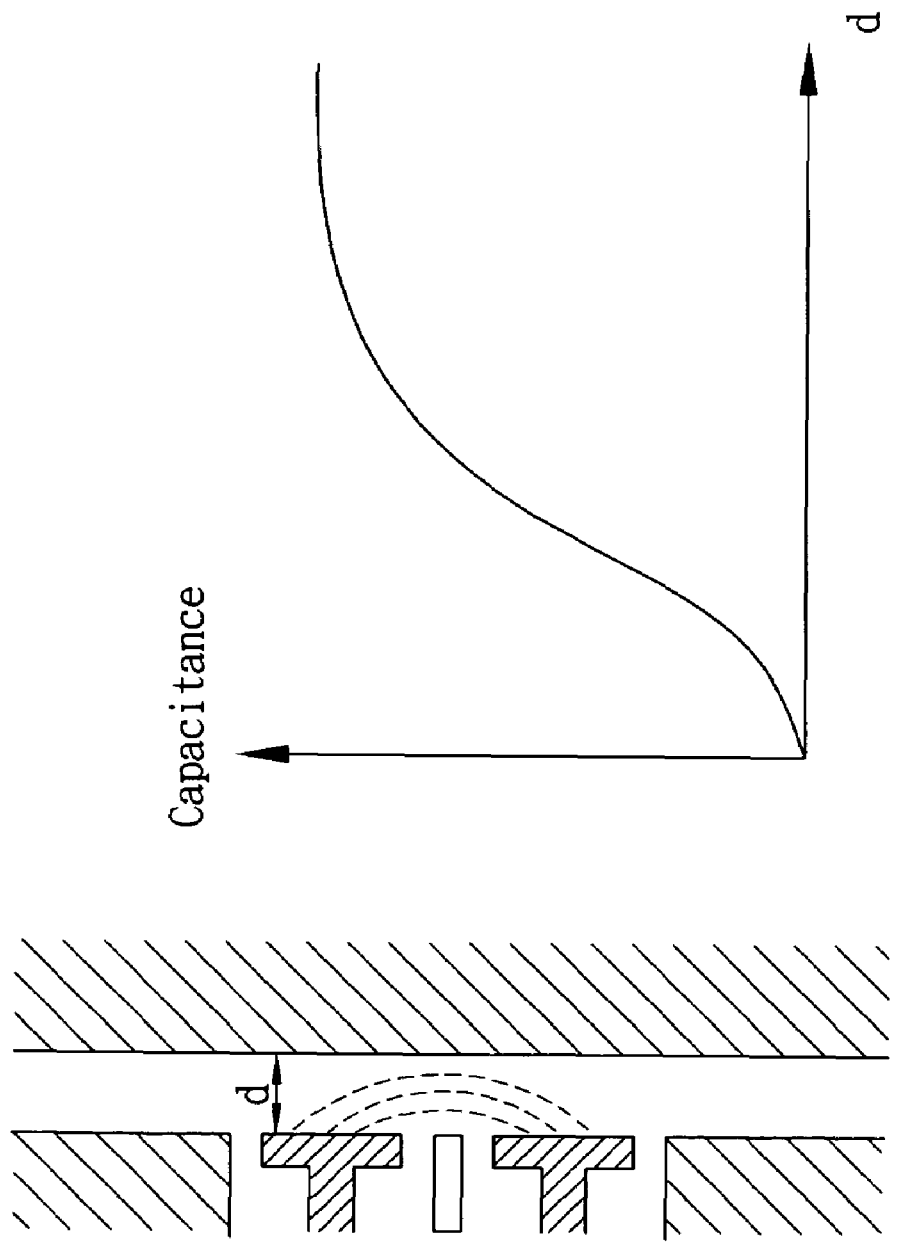
FIG. 5B is a profile of capacitance as a function of the distance for a fringe capacitor.
Figure 6A:
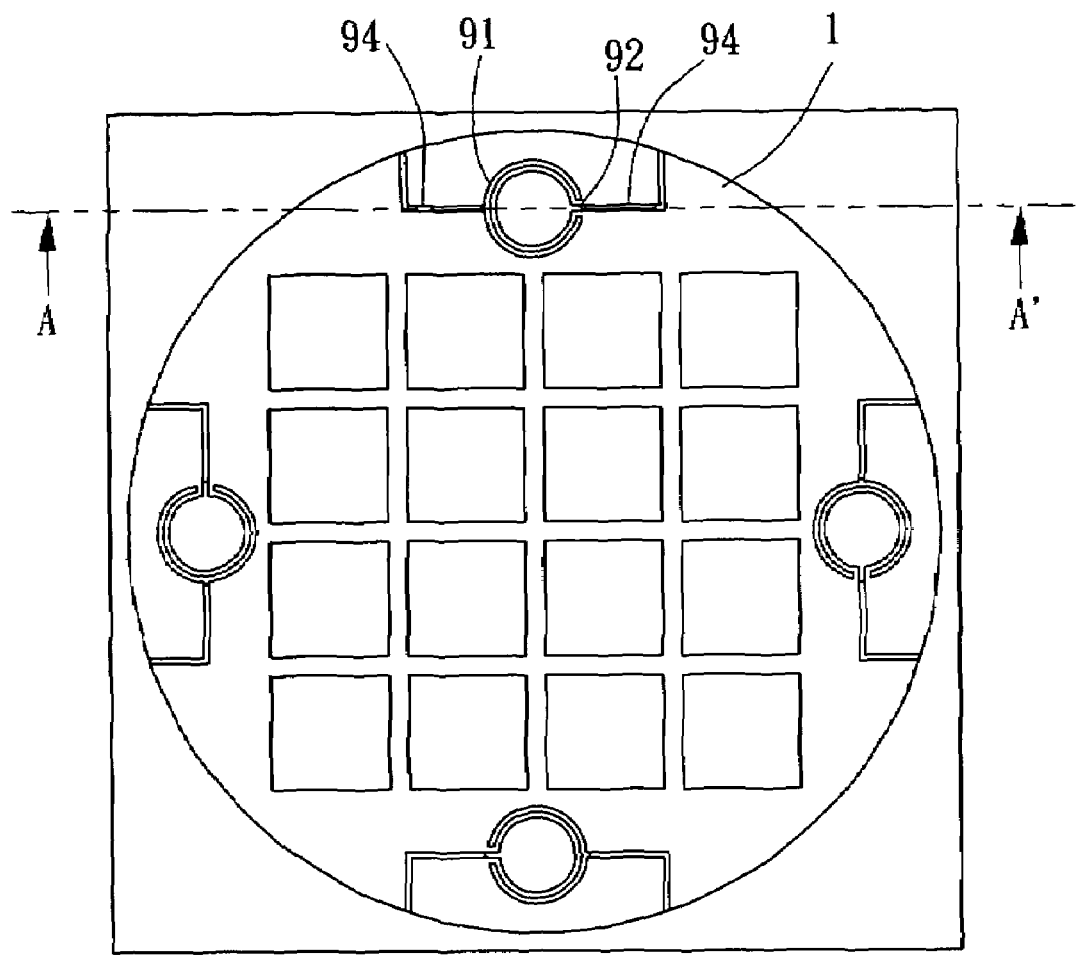
FIGS. 6A and 6B are schematic diagrams of a preferred embodiment of the present invention utilizing a fringe capacitor.
Figure 6B:
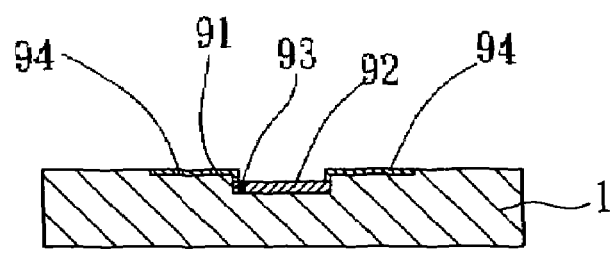

FIG. 5A is a profile of the capacitance as a function of the distance for a conventional plate capacitor, while FIG. 5B is a profile of the capacitance as a function of the distance to a plate for a fringe capacitor. As shown in the figure, the fringe capacitor is composed of a pair of coplanar electrode plates. The capacitance can be varied by changing the relative separation to a plate, which the variation profile can be easily integrated into the method and system of the present invention. FIGS. 6A and 6B show the schematic drawings of another preferred embodiment of the present invention utilizing the fringe capacitive structure. The surface micromachining, IC processing, and MEMS technologies are used to process a plurality pairs of electrode plates 91, 92 on the pattern surface of the master mold 1, wherein an insulator 93 separates the electrode plate 91 and the electrode plate 92. A plurality of wires 94 are utilized to connect with a signal processing system as described in the previous preferred embodiment. When the master mold is pressed into the surface of the resist, the continuous variations in the thickness and material properties will change the capacitance received and processed by the signal processing system. The operations and functions of the signal processing system are similar to those in the previous preferred embodiment, which will therefore be omitted. In summary, by utilizing the capacitive measurement method and system for nanoimprint process monitoring with the capacitive structures of the present invention, the advantages of (1) low input with high sensitivity; (2) large relative variation in dielectric constant; (3) good dynamic property; (4) low energy consumption; and (5) simple structure and good adaptability can be achieved which brighten the future of the automated nanoimprint process technology.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A capacitive measurement method for an imprint process monitoring, comprising steps of:

providing a master mold, said master mold comprising a patterned surface, first top electrode plate device, a second top electrode plate device, a first top wire, and a second top wire, wherein said first top electrode plate device is connected to a signal processing system through said first top wires, said second top electrode plate device is connected to the signal processing system through said second top wire, said first top electrode plate device is corresponding to a first structural section of said patterned surface, said second top electrode device is corresponding to a second structural section of said patterned surface, and said first structural section is different from said second structural section;

providing a supporting base, said supporting base comprising a top surface, a first bottom electrode plate device, a second bottom electrode plate device, a first bottom wire, and a second bottom wire, wherein said first bottom electrode plate device is connected to the signal process system through said first bottom wire, and said second bottom electrode plate device is connected to the signal process system through said second bottom wire;

arranging a substrate coated with a resist on the top surface of the supporting base;

placing the master mold above the substrate so that the patterned surface is corresponding to the top surface, and to form a first capacitive device with said first top electrode plate device and said first bottom electrode plate device, and to form a second capacitive device with said second electrode plate device and said second bottom electrode plate device;

imprinting the master mold onto the resist of the top surface of the substrate, wherein said first capacitive device is corresponding to a first capacitance varied by said resist imprinted by said first structural section, and said second capacitive device is corresponding to a second capacitance varied by said resist imprinted by said second structural section; and monitoring the imprinting according to the capacitance variation received by the signal processing system from said first capacitive device and said second capacitive device.

2. The capacitive measurement method for an imprint process monitoring according to claim 1, wherein said signal processing system has a default value for comparing with the capacitance variation received by the same to determine the timing of stopping the imprint process.

3. The capacitive measurement method for an imprint process monitoring according to claim 1, wherein said signal processing system has a default value for comparing with each difference between the plural capacitance variations received by the same to monitor and control the flatness in the imprint process.

4. A capacitive measurement method for an imprint process monitoring, comprising steps of:

providing a master mold, said master mold comprising a patterned surface with a first paired electrode plate devices and a second paired electrode plate device disposed thereon, wherein said first paired electrode plate device forms a first fringe capacitor, said second paired electrode plate device forms a second fringe capacitor, the first and second fringe capacitors being connected to a signal processing system through a first paired wire and a second paired wire, said first paired electrode plate device is corresponding to a first structural section of said patterned surface, said second paired electrode plate device is corresponding to a second structural section of said patterned surface, and said first structural section is different from said second structural section;

providing a substrate coated with a resist;

imprinting the patterned surface of the master mold onto the resist, wherein said first fringe capacitor is corresponding to a first capacitance varied by said resist imprinted by said first structural section, and said second fringe capacitor is corresponding to a second capacitance varied by said resist imprinted by said second structural section; and monitoring the imprinting according to the capacitance variation received by the signal processing system from said first paired electrode plate device and said second paired electrode plate device.

5. The capacitive measurement method for an imprint process monitoring according to claim 4, wherein said signal processing system has a default value for comparing with the capacitance variation received by the same to determine the timing of stopping the imprint process.

6. The capacitive measurement method for an imprint processmonitoring according to claim 4, wherein said signal processing system has a default value for comparing with each difference between the plural capacitance variations received by the same to monitor and control the flatness in the imprint process.

\* \* \* \* \*